United States Patent [19]

Romrell

[11] 4,017,794

[45] Apr. 12, 1977

[54] CIRCUIT FOR MEASURING TIME DIFFERENCES AMONG EVENTS

[75] Inventor: Delwin M. Romrell, Richland, Wash.

[73] Assignee: The United States of America as represented by the United States Energy Research and Development Administration, Washington, D.C.

[22] Filed: Sept. 18, 1975

[21] Appl. No.: 614,404

[52] U.S. Cl. .............................. 324/78 D; 324/178

[51] Int. Cl.[2] ........................................ G01R 23/02

[58] Field of Search ................ 324/78 D, 181, 178; 235/92 T, 92 TF

[56] References Cited

UNITED STATES PATENTS

| | | | |
|---|---|---|---|
| 3,304,504 | 2/1967 | Horlander | 324/78 D |
| 3,569,830 | 3/1971 | Gass | 324/78 D |

*Primary Examiner*—Rudolph V. Rolinec

*Assistant Examiner*—Michael J. Tokar

*Attorney, Agent, or Firm*—Dean E. Carlson; Arthur A. Churm; Donald P. Reynolds

[57] ABSTRACT

An electronic circuit has a plurality of input terminals. Application of a first input signal to any one of the terminals initiates a timing sequence. Later inputs to the same terminal are ignored but a later input to any other terminal of the plurality generates a signal which can be used to measure the time difference between the later input and the first input signal. Also, such time differences may be measured between the first input signal and an input signal to any other terminal of the plurality or the circuit may be reset at any time by an external reset signal.

3 Claims, 3 Drawing Figures

CIRCUIT FOR MEASURING TIME DIFFERENCES AMONG EVENTS

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

This invention relates to a method and means of determining the relative timing between electrical signals from two or more sources, the signals occurring randomly in time.

Many applications require a measurement of the time at which the first event of a randomly occurring sequence of events occurs and also requires a measurement of the time differences between the first occurring event and each one of a number of later occurring events. An example of such an application is the location of the source of an acoustic wave by determining which of a number of acoustic sensors first detects the wave, which is next to detect the wave, and the time between the successive occurrences. In addition to nondestructive testing of materials, other possible applications include seismic monitoring, sonar direction finding, and the timing of events, as, for example, on a production line. When there is no preferred direction from which signals are expected or no expected order among several signals, it is necessary to have no preferred sensor or time recorder and to allow the first sensor or time recorder that receives a signal to initiate a time sequence. This sensor or time recorder must be disabled from being further actuated during a measuring interval while other sensors or time recorders are left to generate signals terminating the measuring interval when they receive signals. While two sensors are, in general, enough to determine the line along which a wave front moves, the actual direction can be determined and backup information for better precision can be obtained by using more than two sensors. When two sensors alone are used, well-known flip-flop circuits suffice to start and stop the timing measurements. However, no circuits are known to exist that allow any one of a number greater than two sensors to initiate a timing sequence and any other ones of the sensors to provide measures of the time between initiation and receipt of the signal at each of the other sensors.

It is an object of the present invention to provide a measurement of the time difference between two events of a group of two or more events where the order in which the events occur is random.

It is a further object of the present invention to receive signals from three or more sources, to identify which of the sources sent the first signal, and to provide a measure of the time at which a signal was later received from any or all of the other sources.

Other objects will become apparent in the course of a detailed description of the invention.

SUMMARY OF THE INVENTION

An electronic circuit has a plurality of input terminals. After the circuit is reset, reception of a signal at any one of the input terminals causes the outputs associated with all terminals to reverse except for those outputs associated with the terminal receiving the input signal. The later reception of a signal at any other input terminal causes a second reversal to restore the reset condition at the output terminal associated with the other input. The operation may either be continued until all input terminals have received signals and then reset or may be terminated at any time and restarted with a reset pulse. The output signals are usable to identify which terminal first received an input and the times between the first input and later inputs to other terminals. Repeated inputs to the same terminal during one operating cycle are ignored.

DETAILED DESCRIPTION OF THE PREFERRED EMBODIMENT

Figure 1:
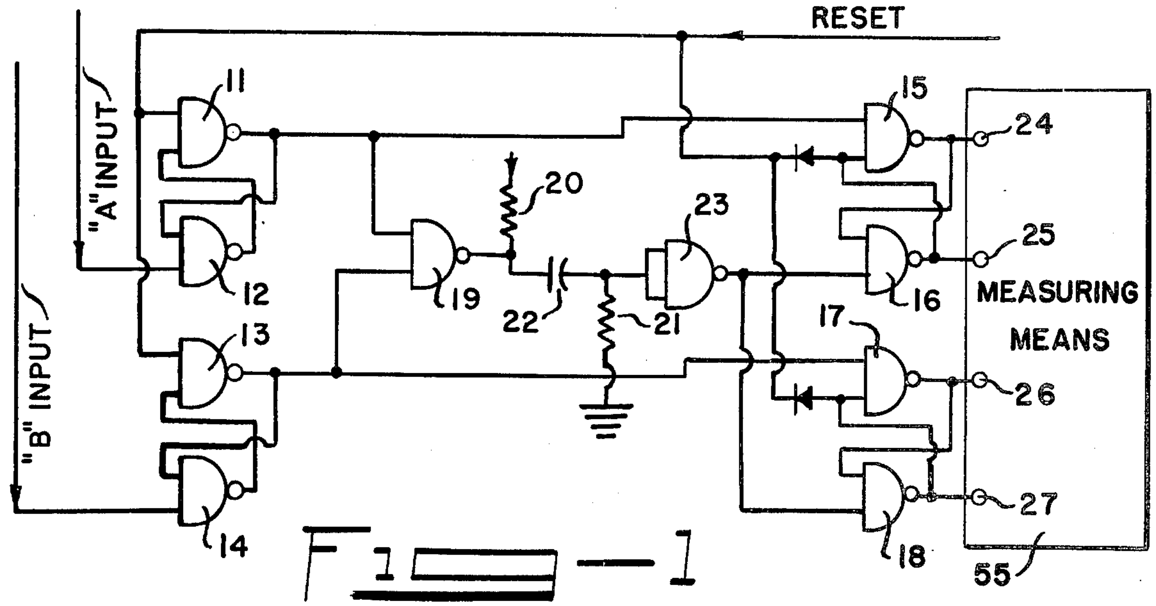
FIG. 1 is a two-input circuit for the practice of the present invention.

FIG. 1 is a circuit diagram of a two-input circuit for the practice of the present invention. In FIG. 1, NAND gates 11 and 12 are cross-connected to form a latch with two inputs, as are NAND gates 13 and 14. The term "latch" describes an electronic circuit with two or more inputs and two stable states. Each input is associated with a particular stable state such that application of an input will cause the latch to assume the associated state if it is not in that state or to stay there if it is. NAND gates 15 and 16 are cross-connected to form a latch with three inputs, as are NAND gates 17 and 18. The output of NAND gate 11 is applied as an input to NAND gate 19 and also as an input to NAND gate 15. The output of NAND gate 13 is applied as an input to NAND gate 19 and also as an input to NAND gate 17. The inputs to be timed are referred to as the "A" input and the "B" input. The "A" input is applied to an input terminal of NAND gate 12 and the "B" input is applied to an input terminal of NAND gate 14. A reset pulse is coupled directly to inputs to NAND gate 11 and NAND gate 13 and is coupled through diodes **15*a* and 17*a* to inputs to NAND gates 15 and 17. The output of NAND gate 19 is differentiated by the combination of resistors 20 and 21 and capacitor 22 and the differentiated signal is applied to NAND gate 23 which is connected as an inverter. The output of NAND gate 23 is applied as an input to NAND gates 16 and 18. Outputs from the circuit are taken at terminals 24, 25, 26 and 27, all with respect to ground, and are connected to measuring means 55. The outputs at terminals 24 and 25 are electrically complementary to each other, as are those at terminals 26 and 27. This means that when terminal 24 is at a high level, terminal 25 is low, and vice versa. A negative reset pulse causes the output of NAND gates 11, 13, 15 and 17 to go to a high level. The output of NAND gate 19 is low and the circuit is in a ready condition. Suppose now an input at the "A" input terminal to NAND gate 12. The output of gate 11 will reverse, causing gate 19 to go positive. This change is differentiated in resistors 20 and 21 and capacitor 22 to generate and apply a pulse to NAND gate 23. The output of NAND gate 23 is a short negative pulse which is applied to NAND gates 16 and 18. The result of these signals is that the voltage at terminals 24 and 25 remains unchanged while the voltages at terminals 26 and 27 are reversed. That is, when the "A" input is applied to gate 12, the output at terminal 26** goes negative and that at terminal 27 goes positive. Further inputs at the "A" input terminal have no effect on the circuit, but a later input at the "B" input terminal to NAND gate 14 leaves the voltage at terminals 24 and 25 unchanged while causing a reversal at terminals 26 and 27. Thus, terminals 26 and 27 are returned to the voltage that they had when the circuit was reset. Further inputs to either the "A" input terminal or the "B" input terminal will have no effect on the circuit, which will be readied for further operation only by another reset pulse.

Figure 2:
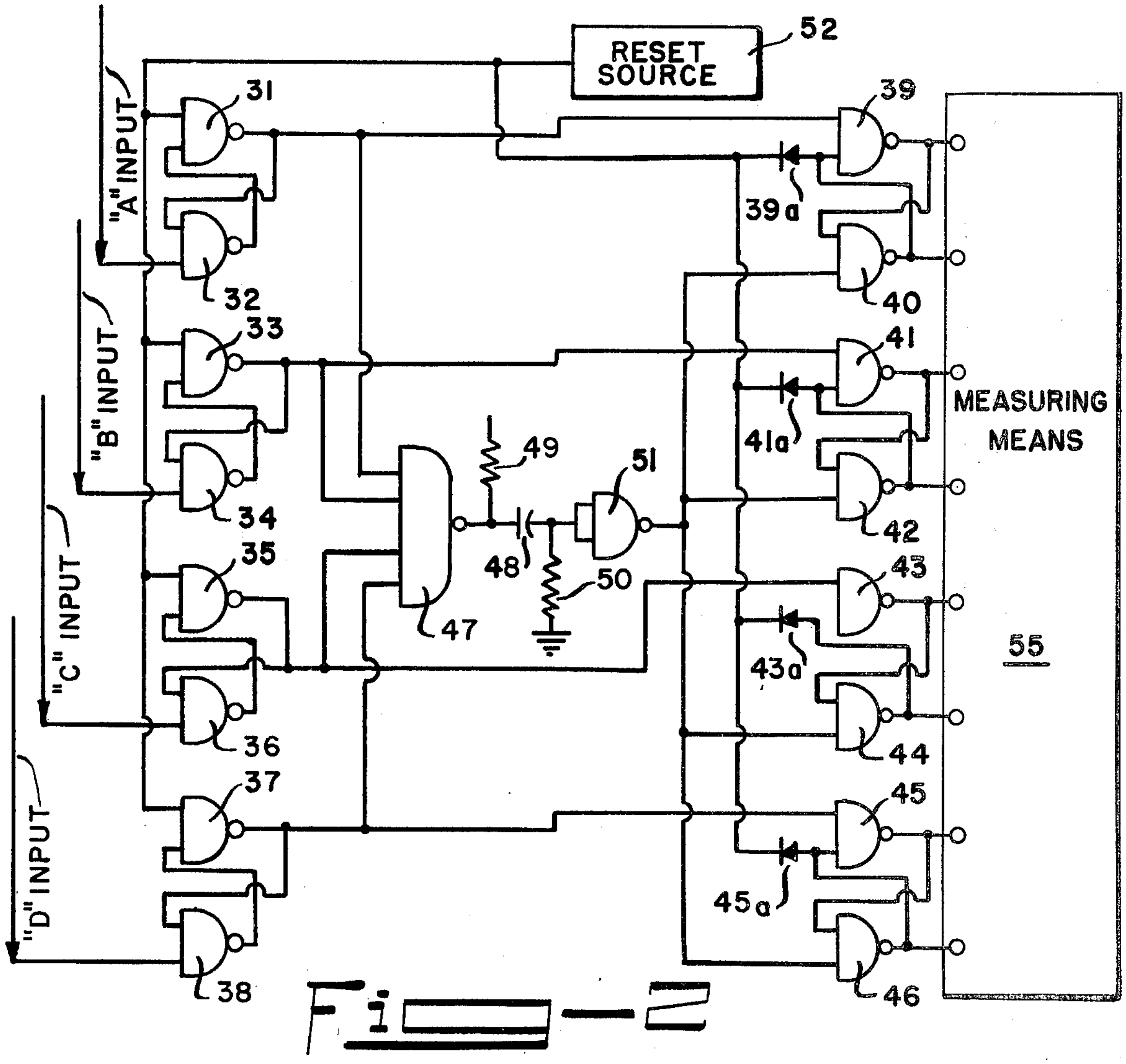
FIG. 2 is a four-input circuit for the practice of the present invention.

A more versatile circuit for the practice of the present invention is shown in FIG. 2 which is an expansion to four inputs of the circuit shown in FIG. 1. The four inputs shown in FIG. 2 are for purposes of illustration. It is possible by increasing the number of paralleled elements to increase to any desired figure the number of inputs that can be handled. In FIG. 2, NAND gates 31 and 32 are cross-connected to form a two-input bistable latch for the "A" input. NAND gates 33 and 34 are cross-connected to form a two-input bistable latch for the "B" input. NAND gates 35 and 36 are cross-connected to form a two-input bistable latch for the "C" input, and NAND gates 37 and 38 are cross-connected to form a two-input bistable latch for the "D" input. NAND gates 39 and 40 are connected to provide a three-input bistable latch, as are NAND gates 41 and 42, 43 and 44, and 45 and 46. A reset pulse is coupled directly to the inputs to gates 31, 33, 35 and 37. The reset pulse is also coupled to each of the NAND gates 39, 41, 43 and 45 through diodes 39*a*, 41*a*, 43*a*, and 45*a*, respectively. The outputs of gates 31, 33, 35 and 37 are all connected as inputs to NAND gate 47. The output of NAND gate 47 is connected to capacitor 48 which forms, together with resistors 49 and 50, a differentiator on the output of NAND gate 47. The differentiated signal is applied to NAND gate 51 which is connected to operate as an inverter and the inverted pulse at the output of NAND gate 51 is applied as an input to NAND gates 40, 42, 44 and 46. The output of NAND gate 31 is also connected directly as an input to NAND gate 39. The output of NAND gate 33 is also connected directly as an input to NAND gate 41. The output of NAND gate 35 is connected directly as an input to NAND gate 43 and the output of NAND gate 37 is connected directly as an input to NAND gate 45. The outputs of NAND gates 39, 40, 41, 42, 43, 44, 45, and 46 are connected to measuring means 55. Reset source 52 supplies a negative pulse to reset all the circuit elements to a ready condition.

Figure 3:
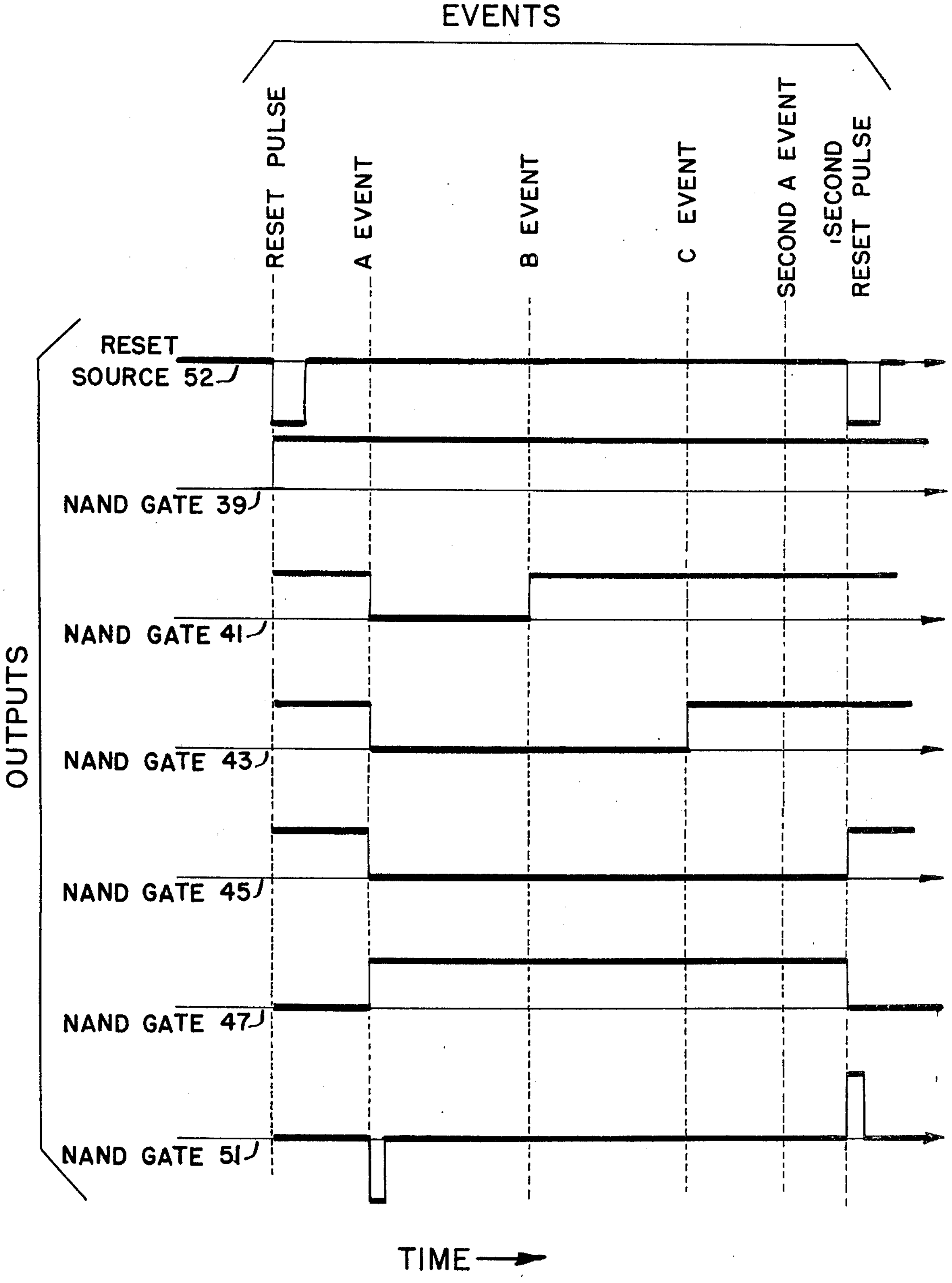
FIG. 3 is a sketch of waveforms in the circuit of FIG. 2.

Operation of the circuit of FIG. 2 is best understood by referring to FIG. 3 which is a sketch of typical waveforms showing one cycle of operation of the circuit of FIG. 2 as received by measuring means 55, with all waveforms plotted as a function of time. Each waveform in FIG. 3 is an output voltage of the correspondingly numbered NAND gate except for the top signal which is the output of reset source 52. The circuit is set in a ready condition by a negative reset pulse from reset source 52, as shown. Regardless of the conditions of the circuit elements before this time, the outputs from NAND gates 39, 41, 43 and 45 will be positive following the reset pulse. The outputs of gates 31, 33, 35 and 37, which are not plotted here, will be driven positive by the reset pulse, and these positive signals cause a negative output from NAND gate 47. The operation of NAND gate 51 is not of consequence at this point. After a period of time in a ready condition, suppose now a negative pulse is applied at the "A" input terminal to NAND gate 32 of FIG. 2. This is identified in FIG. 3 as an "A" event. The outputs of gates 33, 35 and 37 of FIG. 2 will be unaffected by the "A" event, but the output of gate 31 will be driven negative. This will cause the output of gate 47 to go positive. The change at the output of gate 47 is differentiated by capacitor 48 and resistors 49 and 50, generating a short negative pulse at the output of gate 51. With gate 39 of FIG. 2 receiving a negative input logic level and gate 40 of FIG. 2 also receiving a negative input pulse, the output of gate 39 is unchanged by the "A" event, as shown in FIG. 3. However, the negative output pulse from NAND gate 51 causes a reversal of polarity on the outputs of NAND gates 41, 43 and 45, causing them to go negative and hold there. Suppose at a later time a negative signal input is applied to "B" NAND gate 34 of FIG. 2 at a time identified in FIG. 3 as a "B" event. The output of gates 39, 43, 45, 47, and 51 will be unchanged by the "B" event. Only gate 41 of the output shown in FIG. 3 will reverse in polarity, going positive. The output of NAND gate 41 thus shows two things: first, that another gate received an input, causing gate 41 to reverse in polarity and, second, that the "B" event caused gate 41 to return to its original polarity.

Suppose now a signal is applied to "C" input gate 36 of FIG. 2 at a time identified on FIG. 3 as a "C" event. Of the gates whose waveforms are illustrated in FIG. 3, only gate 43 will reverse in polarity. This marks the occurrence of a "C" event. Two features of the circuit of FIG. 2 are illustrated by the events in the balance of the time shown in FIG. 3. First, there is a second "A" event. Inspection of the waveforms in FIG. 3 shows that nothing has happened as a result of the second "A" event. Only the first "A" event had an effect on the circuit waveforms. In addition, it is supposed in FIG. 3 that no "D" event has occurred or, in other words, that during this cycle of operation there has been no negative input pulse to "D" input NAND gate 38 of FIG. 2. As a result, the output pulse at NAND gate 45 is seen in FIG. 3 to have gone negative when the "A" event occurred and to stay negative from that point on until the second reset pulse occurs. The second reset pulse has no effect on the outputs of NAND gates 39, 41 and 43 which were already in the high position. The second reset pulse causes the output of gate 45 to go high, thus readying it for another cycle. Additionally, the second reset pulse causes the output of NAND gate 47 to go low, also in preparation for another cycle. The positive pulse at the output of gate 51 has no effect on the circuit at this time.

It was stated earlier that the outputs of various gates are complementary to one another. Such complementary outputs are not shown in FIG. 3 since they follow by inspection. Thus, in FIG. 3, when gate 39 goes positive with respect to ground, gate 40 goes negative. When gate 41 goes positive, gate 42 goes negative and similarly for gates 43 and 44 and gates 45 and 46. The result is a set of signals that are both positive-going and negative-going that provides the following information about a set of randomly occurring signals. The output of NAND gate 39 shows that an "A" event occurred first. The output of NAND gate 41 shows that a "B" event occurred next and shows the time that lasped between occurrence of the "A" event and occurrence of the "B" event. The output of NAND gate 43 shows that a "C" event occurred and it indicates the time lapse between the occurrence of an "A" event and the occurrence of a "C" event. The output of NAND gate 45 shows that a "D" event did not occur during the present cycle of observation.

Further use of the information in measuring means 55 is not shown specifically because it is considered obvious to one skilled in the art. Thus, a reset pulse from reset source 52 can also be used to reset a number of clocked counters comprising measuring means 55, with each counter connected to one of the outputs of NAND gates 39, 41, 43 and 45 and used as measuring means. Following the cycle of operation depicted in FIG. 3, a reading of zero on the counter connected to NAND gate 39 would indicate that an "A" event occurred first. A nonzero reading of a given number of clock pulses on the counter connected to NAND gate 41 would identify the time delay between the "A" event and the "B" event. The time derived from the counter connected to the output of NAND gate 43 would identify the time between occurrence of the "A" event and occurrence of the "C" event. The fact that the counter connected to the output of NAND gate 45 was still running at the time of the second reset pulse would indicate that no "D" event occurred during the measuring cycle. Such counts could be applied directly to a computer for triangulation using well-known techniques if the inputs were from sources such as sensors depicting acoustic waves. Similarly, routine processing would allow the identification of events on a production line based on information received that identified events as "A", "B", "C" or "D" events. It should be emphasized that the illustration in FIG. 3 happened to begin with an "A" event followed by a "B" event followed by a "C" event. This is not at all necessary to the operation of the circuit. Following a reset pulse from reset source 52 of FIG. 2, an input to any of the "A", "B", "C" or "D" input terminals will begin a corresponding cycle of operation similar to that described in FIG. 3. The first event to occur will begin the operation of the circuit and later-occurring events will generate pulses identifying the time by which they follow the first event to occur.

A circuit for the practice of the present invention has been built and used at the Battelle Pacific Northwest Laboratories. The circuit was used for the detection and ranging of acoustical signals used for nondestructive testing of materials. Gates used in the latches were SN7400, an integrated circuit that contains four NAND gates per chip. The multiple-input NAND gate used for NAND gate 47 of FIG. 2 was an SN7420 and the diodes used to reset gates 39, 41, 43 and 45 of FIG. 2 were 1N4149 diodes. Using the components described above in a circuit for the practice of the present invention, nanosecond resolution between input pulses was achieved routinely. It should be understood that the element numbers that were used are described as typical rather than necessary. NAND logic was useful but it would be a simple matter for one skilled in the art to practice the invention using AND logic. Transistor-transistor logic (TTL) was used in practicing the invention, but diode-transistor logic (DTL), resistor-transistor logic (RTL), or any similar logic functions could equally as well have resulted from a routine design choice. It was convenient to use quad NAND gates in integrated circuits but any gates and any fast diode could be used for the practice of the present invention. Furthermore, the circuit described in FIG. 2 is capable of supplying various outputs or informational signals to control operation of the circuit in different ways. For example, the reset signal was described as being controlled by a clock so that the circuit was reset at period intervals. This could be done either by an absolutely timed clock or it could be controlled by a clock that was reset from the output of NAND gate 47 of FIG. 2 to begin the running of the clock with the receipt of the first of a number of random input signals. Alternatively, the inputs to NAND gate 47 of FIG. 2 could also be connected to a NOR gate to provide a signal to generate a reset only when all the inputs have received signals. As another alternative, it would be routine to use AND logic in the construction of a circuit for the practice of the present invention. These are design choices that add to the versatility of the means for practice of the present invention.

The embodiments of the invention in which an exclusive property or privilege is claimed are defined as follows:

1. A circuit for measuring time differences between randomly arriving signals comprising:

a. a first latch having a first stable state and a second stable state;

b. a second latch having a first stable state and a second stable state;

c. reset means connected to said first and second latches for resetting said first latch to said first stable state and said second latch to said first stable state;

d. operating means connected to said first and second latches and responsive to an input to one of said first and second latches after said first and second latches are reset to cause said one of said first and second latches to maintain said first stable state and to cause the other of said first and second latches to change to said second stable state;

e. return means connected to said first and second latches and responsive to a later input to the other of said first and second latches to cause the other of said latches to return to said first stable state;

f. measuring means connected to said first and second latches and responsive to said changes from said first stable states to said second stable states to determine which of said first and second latches first changed states, which next changed states, and the time between said changes of state, which determination provides a measure of which latch first received a signal and the time between receipt of a signal at a first latch and at a second latch.

2. The circuit of claim 1 comprising in addition a third latch having a first stable state and a second stable state, said third latch connected to said reset means for resetting said third latch to said first stable state, said third latch further connected to said operating means responsive to an input to one of said first, second, and third latches after said first, second, and third latches are reset to cause said one of said first, second, and third latches to maintain said first stable state and to cause the other two of said first, second, and third latches to change to said second stable state, said third latch connected to said return means and responsive to a later input to a second one of said first, second, and third latches to cause said second one of said first, second, and third latches to return to said first stable state, said third latch connected to said measuring means to determine which of said first, second, and third latches first changed states, which secondly changed states, and which thirdly changed states, which determination provides a measure of which latch is first to receive a signal, which latch is second to receive a signal, which latch is third to receive a signal, and the times between pairs of said receipts of signals.

3. An electronic circuit for determining the first of a sequence of randomly timed electrical signals from a plurality of sources and the time between occurrence of the first event and occurrence of later events, the circuit comprising: a plurality of two-input and three-input bistable latches, said two-input latches comprising a first and a second two-input NAND gate, said first NAND gate having a first input that is the first latch input, said first NAND gate having a second input taken from the output of said second two-input NAND gate, said output of said first NAND gate also comprising the latch output, said second two-input NAND gate having as a first input the latch input, said second NAND gate having as a second input the output of said first NAND gate, said three-input latches identical to said two-input latches with said second input to said first two-input NAND gate taken as said third input to said latch, a plurality of said two-input latches having said first latch inputs connected to a reset source and said second latch inputs taken as circuit inputs, a plurality of said three-input latches having said first input of each three element latch connected to the output of a two-input latch, said three-input latches having said third inputs each connected through a diode to said reset source, said three-input latches having said second latch inputs connected in parallel to the output of an inverter, each output of said two-input latches also connected as an input to a multiple input NAND gate, said multiple input NAND gate producing an output, said output connected to a differentiator, the output of said differentiator connected to said inverter, further each NAND gate of each of said three element latches having an output that comprises a circuit output for said circuit, whereby input signals to said circuit input terminals produce signals at said outputs containing information identifying which of said input terminals first received a signal and the time between receipt of said first signals and receipt of later signals at similarly identified locations.

* * * * *